United States Patent [19]

Masumi

[11] Patent Number: 5,554,584
[45] Date of Patent: *Sep. 10, 1996

[54] SUPERCONDUCTIVE PHOTOCONDUCTIVE SUBSTANCE OF THE CA-SR-BI-CU-O GROUP SYSTEM AND A METHOD OF PRODUCING THE SAME

[75] Inventor: Taizo Masumi, Yokohama, Japan

[73] Assignee: University of Tokyo, Tokyo, Japan

[ * ] Notice: The term of this patent shall not extend beyond the expiration date of Pat. No. 5,168,165.

[21] Appl. No.: 377,483

[22] Filed: Jan. 24, 1995

Related U.S. Application Data

[63] Continuation of Ser. No. 945,434, Sep. 14, 1992, abandoned, which is a continuation of Ser. No. 392,802, Aug. 11, 1989, abandoned.

[30] Foreign Application Priority Data

Aug. 12, 1988 [JP] Japan .................................. 63-201654

[51] Int. Cl.$^6$ ...................................................... H01J 29/45
[52] U.S. Cl. ...................... 505/181; 505/480; 250/492.1
[58] Field of Search .................................. 505/181, 325, 505/480; 250/492.1, 492.2

[56] References Cited

U.S. PATENT DOCUMENTS

| | | | |
|---|---|---|---|
| 4,886,776 | 12/1989 | Early et al. | 505/1 |
| 4,959,347 | 9/1990 | Kobayashi et al. | 505/782 |
| 4,990,487 | 2/1991 | Masumi | 505/1 |
| 5,073,209 | 12/1991 | Giancola | 250/492.2 |
| 5,110,792 | 5/1992 | Nakayama et al. | 505/848 |
| 5,168,165 | 12/1992 | Masumi | 505/1 |
| 5,173,606 | 12/1992 | Weinberger et al. | 505/848 |
| 5,371,067 | 12/1994 | Masumi | 505/181 |

OTHER PUBLICATIONS

Cheetham et al., "Control of copper valences in $Bi_2Sr_{2-x}CaCu_2O_8$," Nature, vol. 333, May 5, 1988, p. 21.
Garland, "Fabrication of the $Bi_1Sr_1Ca_1Cu_2O_x$ high $T_c$ superconductor" Appl. Phys. Lett., 52(22), May 30, 1988, pp. 1913–1914.
Inoue et al., "Formation and Decomposition of Superconducting $BiSrCaCu_2O_x$ . . . " Jap. J. Appl. Phys., vol. 27, No. 3, Mar. 1988, pp. L347–349.
Kugimiya et al., "Bi–Sr–Ca–Cu–O superconductor system with critical . . . " Appl. Phys. Lett., 52(22), May 30, 1988, pp. 1895–1896.
Nakao et al., "Magnetron Sputtering of Bi–Ca–Sr–Cu–O Thin Films . . . " Jap. J. Appl. Phys., vol. 27, No. 3, Mar. 1988, pp. L378–380.
Locquet et al., "High Temperature Superconductivity in the Compound . . . " Solid State Comm., vol. 66, No. 4, 1988, pp. 393–395.

(List continued on next page.)

Primary Examiner—George Wyszomierski
Attorney, Agent, or Firm—Sughrue, Mion, Zinn, Macpeak & Seas

[57] ABSTRACT

The disclosed oxide has a general chemical formula of $Ca_{X-x}$-$Sr_x$-$Bi_{(Y-y)}$-$Cu_y$-$O_x$ X being 2 to 3, $0 \leq x < 1$, Y being 3 to 4, $0 < y \leq 2$, and z being 4 to 9, and the oxide shows, at a temperature below 105 to 115 K, both a photoconductivity and an either real or potential superconductivity, namely, "superconductive photoconductivity" in a wavelength range of 530 to 740 nm.

The oxide is made by heating a mixture of starting materials for the above composition of $Ca_{X-x}$-$Sr_x$-$Bi_{Y-y}$-$Cu_y$-$O_z$ at 700°–850° C. for 2–10 hours so as to effect primary sintering for causing solid phase reactions in the mixture, cooling gradually, shaping under pressure, reheating the shaped materials at 750°–880° C. for 2–10 hours so as to effect secondary sintering thereon, cooling, keeping the reheated materials at 500°–600° C. for 2–3 hours and cooling the same either extremely quickly at a rate of 1500–900° C./sec or slowly at a rate of 150–200° C./hour.

4 Claims, 6 Drawing Sheets

OTHER PUBLICATIONS

Shaheen et al., "The Confirmation of Superconductivity in the Bi–Sr–Ca–Cu–O . . . " Solid State Comm., vol. 66, No. 9, 1988, pp. 947–951.

Sullivan et al., "Bi–Sr–Ca–Cu–O superconductivity thin films deposited by . . . " Appl. Phys. Lett., 52(23), Jun. 6, 1988, pp. 1992–1994.

Journal of the Physical Society of Japan, vol. 57, No. 8, Masumi et al., Aug. 1988. (I).

Pramana Journal of Physics, vol. 30, No. 5, Tomy et al., May 1988.

Journal of the Physical Society of Japan, vol. 56, No. 12, Masumi et al., Dec. 1987. (II).

A Novel Spectral Photoconductivity of the Y–Cu–O, Y–Ba–Cu–O Correlative with Superconductivity.

Journal of the Physical Society of Japan vol. 56, No. 9–Sep. 1987.

FIG_3A

FIG_3B

SUPERCONDUCTIVE PHOTOCONDUCTIVE SUBSTANCE OF THE CA-SR-BI-CU-O GROUP SYSTEM AND A METHOD OF PRODUCING THE SAME

This is a Continuation of application Ser. No. 07/945,434 filed on Sep. 14, 1992 (abandoned), which is a continuation of prior application Ser. No. 07/392,801 filed Aug. 11, 1989 (abandoned).

BACKGROUND OF THE INVENTION

1. Field of the Invention

This invention relates to superconductive photoconductive-substance of the Ca-Sr-Bi-Cu-O group system and a method for producing the same, which oxide has a composition outside that of a regular superconductor and exhibits a photoconductivity along with an either real or potential superconductivity.

As an outcome of experiments on optical properties, especially on the photoconductivity in response to high-speed laser pulses, of those oxides whose composition falls outside the critical composition range of a regular superconductor, the inventor has succeeded in finding a superconductive oxide of the $Ca_{(X-x)}$-$Sr_x$-$Bi_{(Y-y)}$-$Cu_y$-$O_z$ group that reveals photo-conductivity which is unexpected from the standpoint of conventional common sense. The invention is based on such findings.

The invention also relates to a method for producing the above oxide. In the method, the ingredient concentrations X, x, Y, y and z in the above-mentioned general formula are controlled, for instance by selecting X=2, Y=3, y=2, and a photoconductive oxide with an either real or potential superconductivity is produced by keeping the above concentration x close to zero in the $0 \leq x < 1$ range or by cooling extremely quickly. The oxide of the invention is expected to be very useful in the industrial field of "superconductive optoelectronics".

1. Related Art Statement

There have been no publications at all on such superconductor which has inherent photoconductivity, except the inventor's disclosure in his technical papers and his patent applications; for instance, a superconductive photoconductive oxide of the $Y_{3-x}$-$Ba_x$-$Cu_y$-$O_z$ group (U.S. patent application Ser. No. 244,240) and a superconductive photoconductive oxide of $La_2$-$Cu_y$-$O_z$ group (U.S. Patent Application Serial No. 244,274).

Conventional superconductors are metals or alloys thereof in the main. Recently, much attention has been paid to high-temperature oxide superconductors, such as superconductors of the Y-Ba-Cu-O group, and considerable amounts of additives such as barium (Ba) and strontium (Sr) are used to raise the superconductive critical temperature (Tc). In view of the metallic properties of such a superconductive substance, studies and measurements on their optical properties at and in the proximity of visible wavelengths have been limited to the study of reflection and scattering of light therefrom as a part of the study on the overall nature of the metal.

In general, it has been believed that light is simply reflected from the surface of a superconductor and is not allowed to enter therein. Study of optical properties, except the phenomena of reflection and scattering, has been treated as a completely different field from that of superconductivity. This has been a main trend in academic institutions, domestic and abroad, and in international conferences.

The reason for the trend is in that researchers have considered that superconductivity is incompatible with such physical properties as light absorption and photoconductivity and they have assumed that light irradiation in a wave number with the excess energy over the energy gap of the BCS theory will merely destroy the stability of superconductivity. However, there is a certain clear correlation between them, as proven in the case of a Y-Ba-Cu-O group substance and the like. If any substance having both superconductive capability and photoconductive capability is produced, a number of new electronic and optoelectronic devices may be developed; for instance, a superconductive photo-transistor, a "superconductive optical computer" as a combination of the "superconductive computer" based on the Josephson devices and the "optical computer" proposed in optoelectronics both currently studied; "superconductive optical fiber" and the like

SUMMARY OF THE INVENTION

Therefore, an object of the present invention is to provide superconductive photoconductive-substance which reveals a superconductive photoconductivity, i.e., both a superconductivity and a photoconductivity at a temperature below its critical temperature for revealing the superconductivity.

The superconductive photoconductive-substance according to the invention has a general chemical formula of $Ca_{X-x}$-$Sr_x$-$Bi_{(Y-y)}$-$Cu_y$-$O_z$, X being 2 to 3, $0 \leq x < 1$, Y being 3 to 4, $0 < y \leq 1$, and z being 4 to 9, and the substance shows an either real or potential superconductivity at a temperature below 105 to 115 K, or at least below 65 to 85 K, and simultaneously shows a photoconductivity in a wavelength range of 530 to 740 nm at a temperature below 105 to 115 K, or at least below 65 to 85 K.

Another object of the present invention is to provide a method for producing the above-mentioned superconductive photoconductive-substance with a general chemical formula of $Ca_{(X-x)}$-$Sr_x$-$Bi_{(Y-y)}$-$Cu_y$-$O_z$, X being 2 to 3, $0 \leq x < 1$, Y being 3 to 4, $0 < y \leq 2$, and z being 4 to 9, which method comprises the steps of preparing a mixture of starting materials for the above substance, heating the mixture at 700°–850° C. for 2–10 hours, gradually cooling, shaping under pressure, reheating at 750°–880° C. for secondary sintering, cooling gradually, keeping at 600°–500° C. for 2–3 hours, and then cooling either extremely quickly at a rate of 1500°–900° C./sec or slowly at a rate of 150°–200° C./hour, whereby the substance becomes to have a photoconductivity associated with a superconductivity or to have both a superconductivity and a photoconductivity.

The reason for limiting the composition of the substance of the invention to the above-mentioned general chemical formula is in that the substance of such composition reveals a photoconductivity associated with a superconductivity, or reveals both a superconductivity and a photoconductivity, provided that it is treated by the method of the invention; namely, through the steps of heating at about 700°–850° C. for 2–10 hours so as to cause solid phase reactions among the starting materials thereof, cooling gradually, shaping under pressure, secondarily sintering at 750°–880° C. for 2–10 hours, cooling gradually, keeping at 600°–500° C. for 2–3 hours, and then cooling either extremely quickly at a rate of 1500°–900° C./sec or slowly at a rate of 150°–200° C./hour. As shown in the ensuing embodiments, the substance thus produced has such temperature dependence and exciting light wavelength dependence that it reveals potential superconductivity in a domain of insulating substance.

The invention has been accomplished based on systematic studies of the above phenomena.

Most of conventionally known oxide substances, such as Ba-Pb-Bi-O, La-Cu-O, and Y-Ba-Cu-O, are normally insulators or semiconductors at the ground state, e.g., at low temperatures and in the dark. An elementary excitation can be created by giving a suitable amount of energy with the corresponding momentum. Usually, for superconductors, these excitations beyond the energy gap merely destroy the superconductive ground stage in the BCS theory. There is a possibility, however, to create a coherent state of elementary excitations above the ground state of insulating semiconductors such as bipolarons and excitons even in a thermally non-equilibrium state. This inventor found a new substance as an outcome of studies in fundamental physics and applied physics from the standpoint of the elementary excitation concept, in a sense parallel to, but rather orthogonal to the trend of studies of high-Tc (critical temperature) superconductors. Namely, the inventor's finding relates to substance whose composition does not result in a perfect superconductor, but the substance has a composition close to that of superconductor and reveals both a superconductivity and a photoconductivity. The present invention has been completed based on that finding.

The reason for selecting the general chemical formula of $Ca_{(X-x)}-Sr_x-Bi_{(Y-y)}-Cu_y-O_z$, X being 2 to 3, $0 \leq x<1$, Y being 3 to 4, $0<y \leq 2$, and Z being 4 to 9, as a limitation of the composition of the substance of the invention, is in that $x=1$ is excluded because the composition with X being 2 to 3, Y being 3 to 4 and $x=1\sim 2$ results in a superconductor. The inventor has studied such composition range in the proximity of but outside that of a superconductor which might have both a superconductivity and a photoconductivity, and found that an oxide with X Being 2 to 3, Y being 3 to 4 and $0 \leq x<1$ becomes an insulator or a semiconductor, but such insulating or semiconducting oxide reveals a photoconductivity in response to incident light of specific frequencies, i.e., 500–740 nm in terms of wavelength.

The inventor noted the fact that $Bi_2O_3$ shows a photoconductivity in response to visible light of certain frequencies, and he has tried to find metallic elements which, when added, render the $Bi_2O_3$—based substance both superconductive and photoconductive. In particular, addition of Ca, Sr, and Cu has been studied, and as a result, the oxide composition for photoconductive-substance of the above general chemical formula has been invented, which composition is similar to that of a superconductor but does not provide a complete superconductivity.

The concentration range of $0 \leq x<$, $0<y \leq 2$, $4 \leq z \leq 9$ along with X being 2 to 3 and Y being 3 to 4 in the above-mentioned general chemical formula is the condition necessary for making the oxide of the invention potentially superconductive and photoconductive, i.e., a superconductive photoconductive-substance. When $x=0$, the oxide becomes $Ca_X-Sr_x-Bi_{(Y-y)}-Cu_y-O_z$ and this oxide also falls within the scope of the invention.

The reasons for the limitations in the method of the invention will be described now. The two sintering processes, i.e., a primary sintering process of heating at 700°–850° C. for 2–10 hours so as to cause solid phase reactions among starting materials followed by the gradual cooling, shaping under pressure, and a secondary sintering process of heating at 750°–880° C. for 2–10 hours followed by the gradual cooling, are necessary to effect complete solid phase reactions so as to produce a homogeneous solid phase. In the sintering, heating above 880° C. is undesirable because it tends to cause melting, while heating below 700°–750° C. is undesirable because it cannot fulfill the complete solid phase reactions.

The process of keeping at 500°–600° C. for 2–3 hours is for annealing in order to remove strains and to homogenize the alloy, which strains are caused during the machining for the shaping under pressure and by the secondary sintering.

The cooling after the annealing, either extremely quickly at a rate of 1500°–900° C./sec or slowly at a rate of 150°–200° C./hour, is to regulate the oxygen concentration z in the expression of $O_z$. In the extremely rapid quenching, the faster the cooling is, the smaller the oxygen concentration z in Oz becomes. When the cooling is slow, the oxygen concentration z of $O_z$ is kept at a large value.

BRIEF DESCRIPTION OF THE DRAWINGS

For a better understanding of the invention, reference is made to the accompanying drawings, in which.

DESCRIPTION OF THE PREFERRED EMBODIMENT

Embodiments

An example of the oxide composition of the invention is $Ca_{(2-x)}Sr_xBi_{(3-y)}Cu_yO_z$, and the inventor has carried out work, with emphasis on the effects of composition, i.e., the change in the phase diagram due to variation in the concentrations x and y. The inventor's studies covered not only the superconductive phase but also the semiconductive phase and insulating phase.

A large number of the specimens of $Ca_{(2-x)}Sr_xBi_{(3-y)}Cu_yO_z$ group were made from powders of $CaCO_3$, $SrCO_3$, $Bi_2O_3$, and CuO. The effect of the starting material composition on the concentrations x and y was checked in detail, and it was found that the concentrations x and y can be controlled by adjusting the starting composition. It was also found that the oxygen concentration z could be controlled, to a certain extent, by regulating the temperature of the secondary sintering and by selecting the rate of cooling after the annealing.

Specimen #S127 was made by preparing a mixture of 0.400 g of $CaCO_3$, 0.466 g of $Bi_2O_3$, 0.318 g of CuO and firing the mixture so as to produce $Ca_2Bi_1Cu_2O_z$. Specimen #S170 was made by preparing a mixture of 0.200 g of $CaCO_3$, 0.295 g of $SrCO_3$, 0.465 g of $Bi_2O_3$, 0.318 g of CuO and firing the mixture so as to produce $Ca_1Sr_1Bi_1Cu_2O_z$. The value of z, i.e., the oxygen concentration, in the above chemical formula was controlled in a range of 5 to 8 by carefully regulating the sintering temperature and the method and speed of cooling. The physical properties of the oxide varied depending on the oxygen concentration z therein.

Starting materials of each specimen were measured so as to be mixed at proper ratios for the desired composition, and the mixture was stirred up thoroughly, heated at 700°–850° C. for 2 hours so as to effect the solid phase reactions of primary sintering, cooled gradually, and shaped into pellets under pressure. The pellets were reheated at 750°–880° C. for 2 to 3 hours for effecting secondary sintering. The specimen #S127 was held at 500° C. for 2 hours and cooled gradually. On the other hand, the specimen #S170 was annealed by reheating at 800° C. for 2 hours and keeping at 500° C. for 1 to 2 hours, and then cooled gradually to room temperature.

Test method

The phase diagram of $Ca_{(x-x)-Srx}-Bi_{(Y-y)}-Cu_y-O_z$ group oxide is complicated, because the oxide is of a 5-element system, and the result of the inventor's study is not yet exhaustive and further studies are necessary to clarify details of the diagram. Very important factors are combinations of the element concentrations X, x, Y, and y in the composition and the control of the oxygen concentration z corresponding to the oxygen vacancy. Despite enormous efforts of a large number of scientists, we have to wait for sometime before the completion of the study. The inventor has paid attention not only to the superconductive phase but also to the semiconductive phase. With a number of the specimens of Ca-Sr-Bi-Cu-O group made from powders of $CaCO_3$, $SrCO_3$, $Bi_2O_3$, and CuO, detailed studies were made on ratios of starting materials in a mixture for each specimen, the process of quick or slow cooling, and the composition was found to be controllable to a certain extent.

Figure 1A:
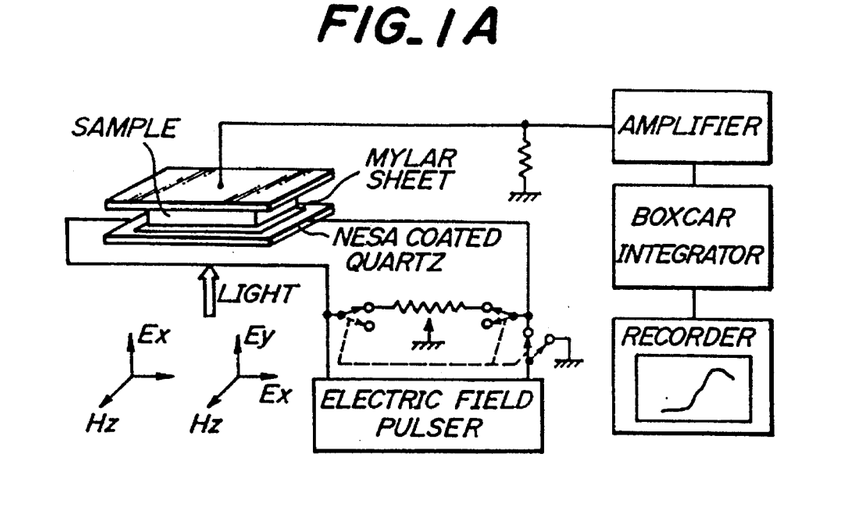
FIGS. 1A and 1B are diagrammatic illustrations of the principles of photoconductivity measurement by using blocking electrodes and applying repetitive pulses.
Figure 1B:
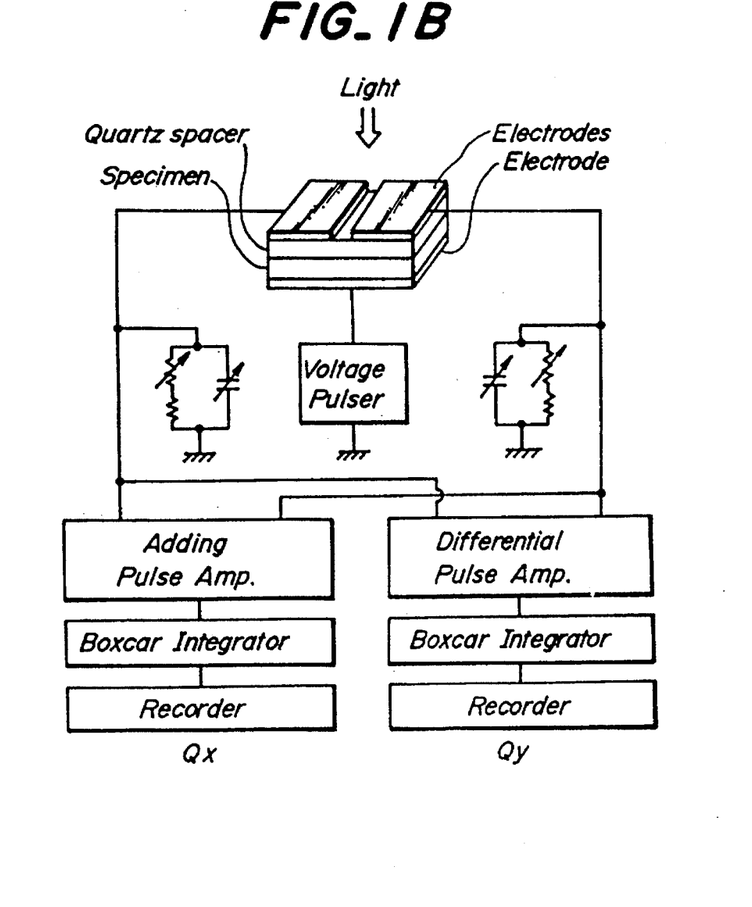
Figure 1C:
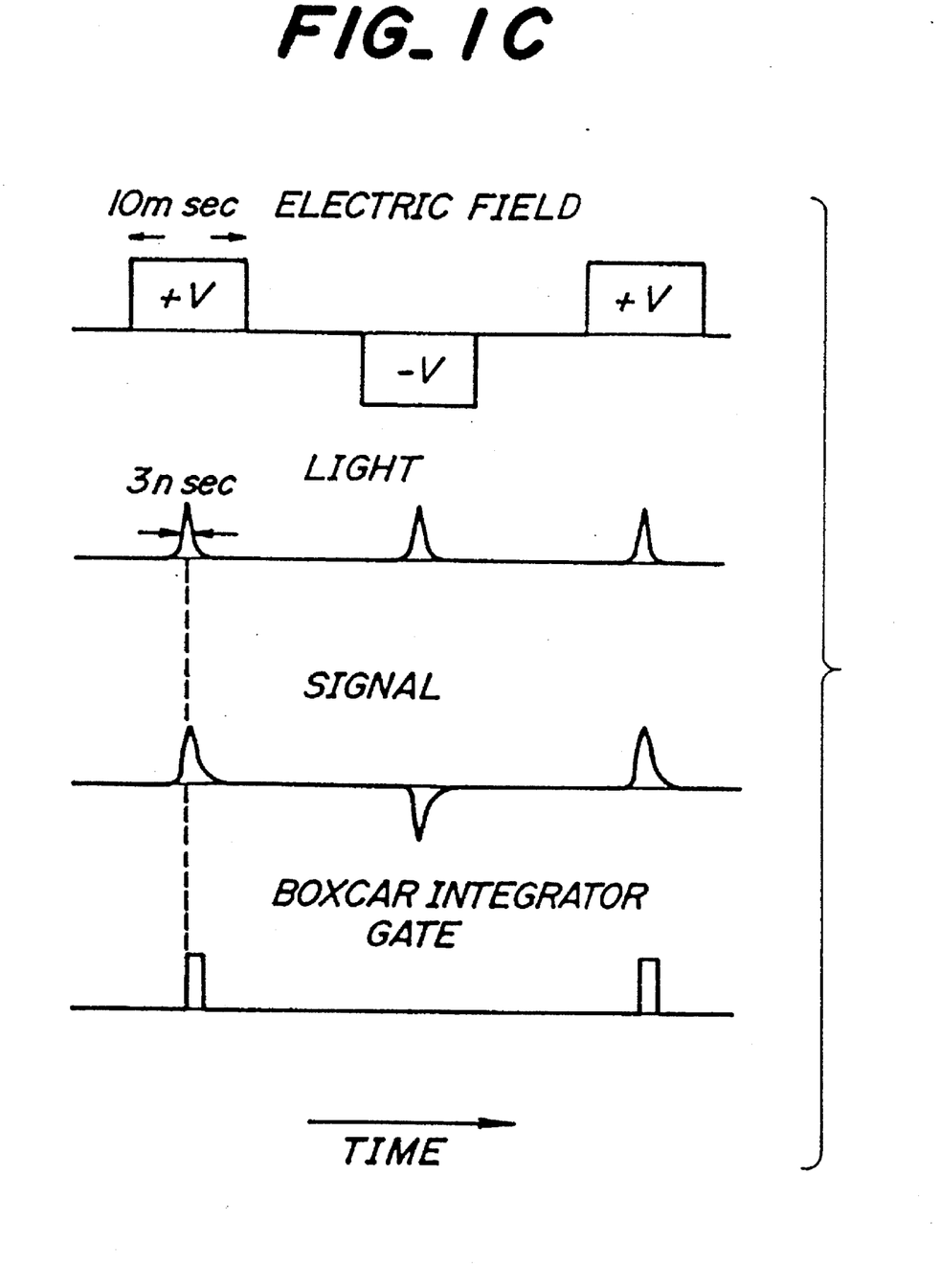
FIG. 1C shows the time sequence and waveforms of an electric field, and laser light pulses in the photoconductivity measurement.

Since specimens of the $Ca_{(2-x)}Sr_xBi_{(3-y)}Cu_yO_z$ group had a very high resistance within a certain value range of x, y and z, or they were semiconductive at least in a low temperature range, two types of techniques were used for the measurement of the resistivity and conductivity. First, to measure the insulating specimen ($\rho \geq 10^8$ Ω-cm), such as the specimen #S127 at 4.2 K, a fast pulse technique with blocking electrodes as shown in FIG. 1A was adopted. Difficulties noted in the preceding applications were overcome by using the fast pulse technique. Transverse mode electrode disposition, as shown in FIG. 1B, was also used for certain measurements. In actual measurement, each electric field pulse E of up to E≅5 kV/cm has a duration of 10 ms at a repetition frequency of 13 Hz, and exciting light beam pulses of 3 ns width were synchronized with the electric field pulses so that each light beam coincides within a certain portion of the electric field pulse E as shown in FIG. 1C. Second, for moderately conductive specimens such as the specimen #S170 ($\rho \leq 10^{-2}$-$10^{-1}$ Ω-cm), regular resistive measurements were carried out by adopting the usual four-probe method in the dark without using the exciting light.

Figure 2A:
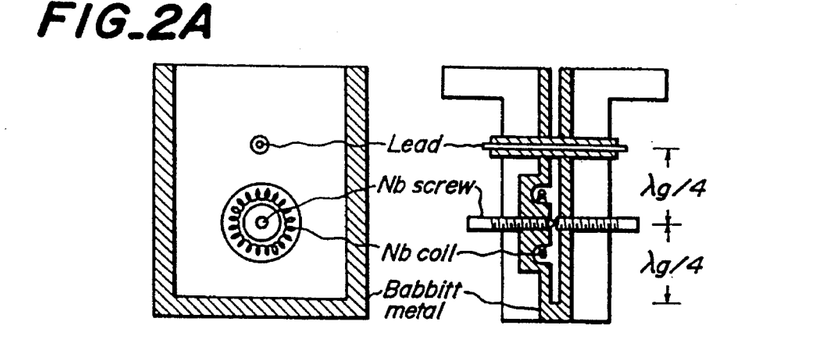
FIG. 2A shows sectional views of an essential part of a static susceptibility measuring device using a microwave SQUID (Superconducting Quantum Interference Device) at 9 GHz.
Figure 2B:
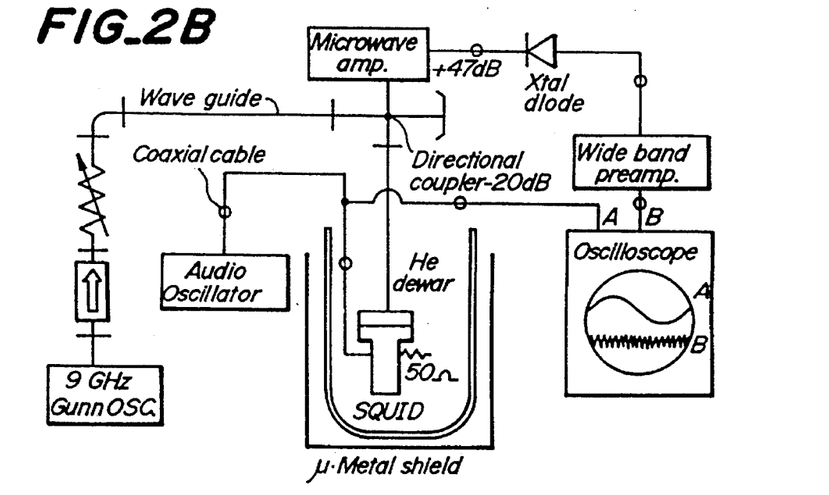
FIG. 2B is a block diagram of the measuring system with the device of FIG. 2A.
Figure 2C:
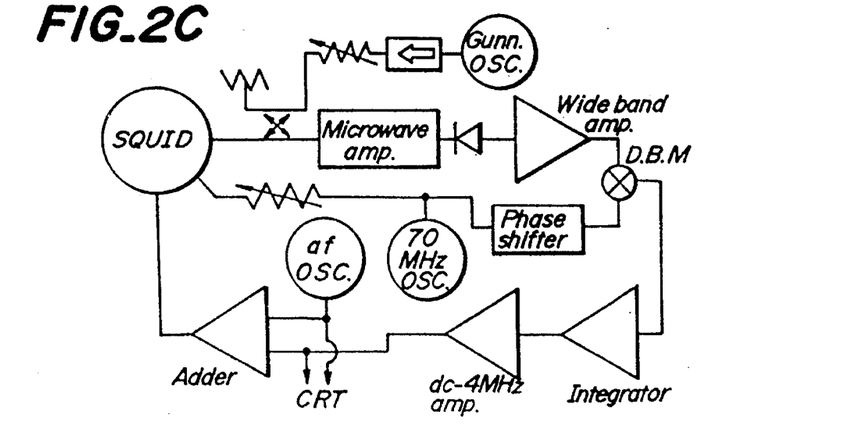
FIG. 2C is a block diagram of the feedback system with the device of FIG. 2A.

Static magnetic susceptibility or magnitude of magnetization M(T,H) was measured in weak fields up to H≅500 Oe by using a microwave SQUID (Superconducting Quantum Interference Device) at 9 GHz as shown in FIGS. 2A, 2B and 2C, in a similar manner to that in the above-mentioned U.S. patent application Ser. Nos. 244,240 and 244,274.

In the measurement of photoconductivity, optical excitation was effected by using a pulsed dye laser. Spectral responses can be of the order of $10^{12}$ cm$^{-3}$ and were also carefully studied in detail. The density of excited photocarriers was of the order of $10^5$ to $10^7/cm^3$, and when the absorption coefficient is large, they can be of the order of $10^{12}$ cm$^{-3}$ in a thin surface layer of $10^{-3}$ to $10^{-4}$ cm thickness. All photosignals were normal detected in the synchronized mode by using the Boxcar integrator.

Experimental Results

The specimen of $Ca_{(2-x)}Sr_xBi_1Cu_2O_z$ (x=1), such as the specimen #S170, looks black, and its resistivity at room temperature is of the order of $\rho \leq 10^{-1}$ Ω-cm. On the other hand, the specimen of $Ca_{(2-x)}Sr_x Bi_1Cu_2O_z$ (x=0), such as the specimen #S127, looks gray, and its resistivity at room temperature is as high as $\rho \geq 10^8$ Ω-cm. The inventor's measurement of the specimen #S127 (x=0, semiconductive) by the above-mentioned transient pulse technique proved that signals indicative of photoconductivity definitely appear at both of two temperatures below 105–115 K and below 65–85 K, probably due to two different mixed phase mechanisms.

It is noted at first that, as to the electric field (E) dependence of the photoresponse Q(λ, T, E), it is substantially linear at about 4.2 K up to E≅5 kV/cm.

Figure 3A:
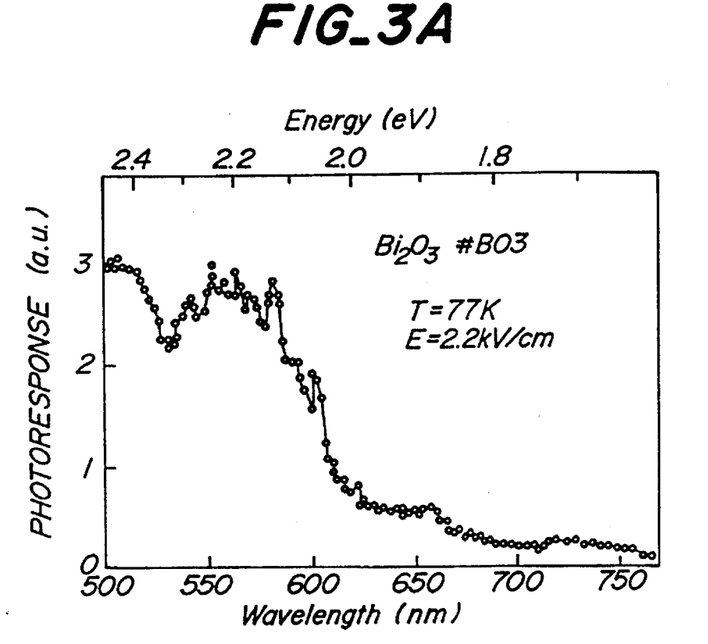
FIG. 3A is a graph showing the wavelength-dependence of photoresponse $Q(\lambda, T)$ of reference substance $Bi_2O_3$.
Figure 3B:
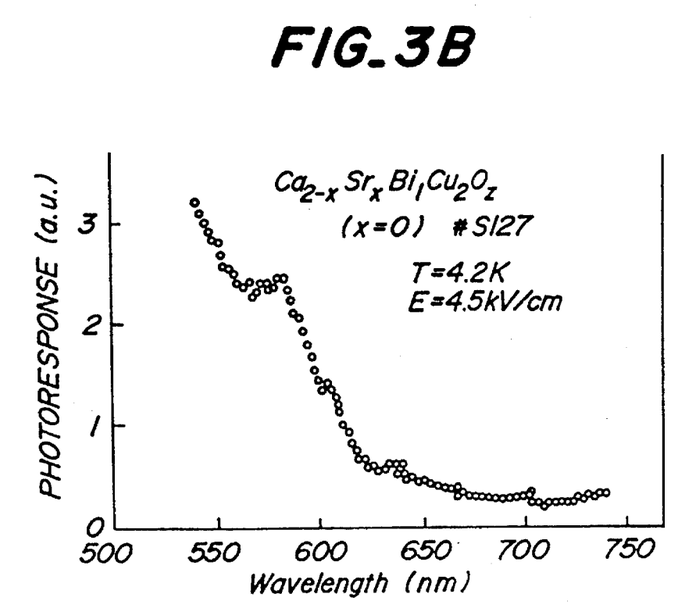
FIG. 3B is a graph showing the wavelength-dependence of photoresponse $Q(\lambda, T)$ of a superconductive photoconductive oxide of the composition $Ca_{(2-x)}-Sr_x-Bi_1-Cu_2-O_x$ ($x=0$)

FIG. 3A illustrates a typical spectrum of pulse-excited transient photoresponse Q(λ, T) of the reference specimen #B03, i.e., $Bi_2O_3$, over wavelength λ of about 500–740 nm, and FIG. 3B illustrates a similar spectrum of the specimen #S127, i.e., $Ca_{(2-x)}Sr_xBi_1Cu_2O_z$ (x=0). It is noted here that the curve of FIG. 3A is probably the first disclosure of this kind of technical knowledge in the world, which relates to the photoconductivity of $Bi_2O_3$ corresponding to light absorption at low temperatures, whereby the curve will be used as a standard reference in the future. The curve was drawn based on the measured data obtained by the inventor.

Figure 4A:
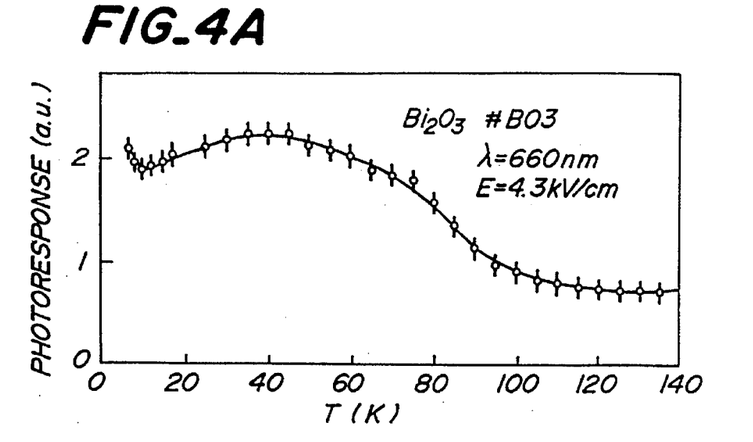
FIG. 4A is a graph showing the temperature-dependence of photoresponse $Q(\lambda, T)$ of the reference substance $Bi_2O_3$ for the wavelength $\lambda=660$ nm.
Figure 4B:
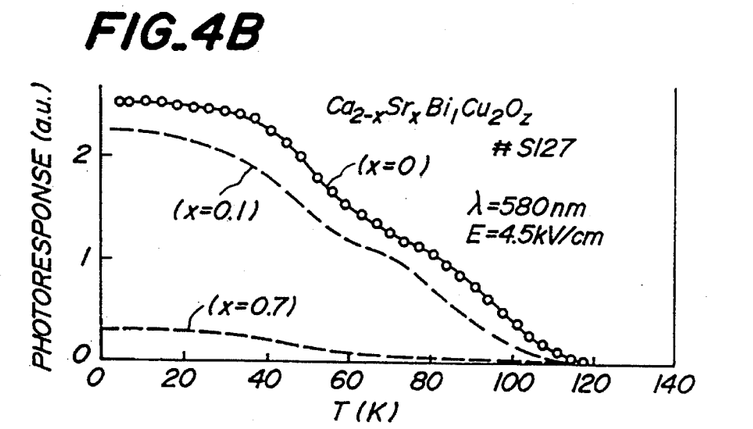
FIG. 4B is a graph showing the temperature-dependence of photoresponse $Q(\lambda, T)$ of a superconductive photoconductive-substance of the composition $Ca_{2-x}-Sr_x-Bi_1-Cu_2-O_z$ ($x=0$) for the wavelength $\lambda=580$ nm.

Next, temperature dependence of the pulse-excited transient photoresponse Q(λ, T) in the wavelengths λ of about 530–740 nm was studied by using the reference specimen #SB03, i.e., $Bi_2O_3$, and the semiconductive specimen #S127, as shown in FIG. 4A and FIG. 4B, respectively. Surprisingly, there definitely exists a systematic similarity in general characteristics of the transient photoresponse Q(λ, T) between the specimens #B03 and #S127. As clearly recognized by anybody from FIGS. 4A and 4B, with decreasing temperature, the "photoresponse" appears at temperatures below 105–115 K and below 65–85 K, even in the semiconductive specimen, as if potential superconductivity exists, and the photoresponse Q increases monotonously and increases again at the temperature below 10 K depending on the case.

Figure 4C:
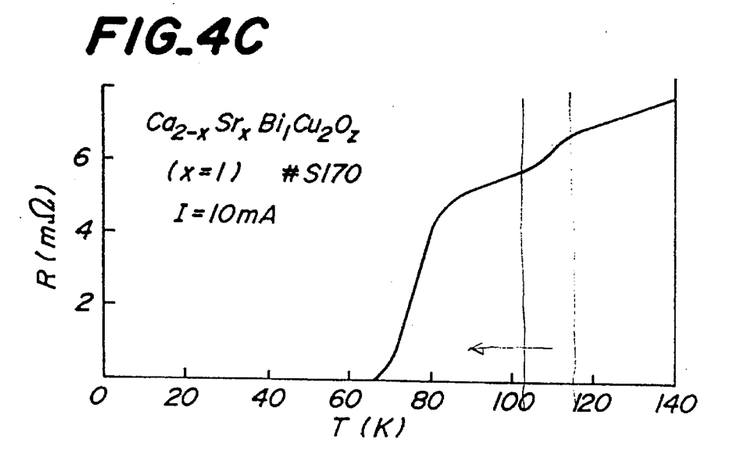
FIG. 4C is a graph showing the temperature-dependence of the dark resistance $R(T)$ of a superconductive substance of the composition $Ca2-x)-Sr_x-Bi_1-Cu_2-O_z$ ($x=1$)

Finally, FIG. 4C shows the dark resistivity ρ(T) of superconductive specimen #S170, i.e., $Ca_1Sr_1Bi_1Cu_2O_z$. As can be noticed immediately by anybody, the specimen #S170 shows superconductivity at a temperature below 105–115 K and at a temperature below 65–85 K, and the photoresponse $Q(\lambda, T)$ coincides with it surprisingly well as shown in FIG. 4B.

It is by no means easy to interpret these experimental facts. Careful checking and evaluation show that heating effects of specimens by the exciting light is very small. At 300 K, the specimen #S127 $Ca_{(2-x)}Sr_xBi_1Cu_2O_z$ (x=0) behaves like a semiconductor. Its "photoconductivity" observed with the blocking electrodes probably has close correlation with the "superconductivity" of the superconductive specimen #S170. This is probably due to the superconductive characters of the insulating part of the specimen, as shown in FIGS. 3A, 3B and FIGS. 4A, 4B, 4C. Surprisingly, there exists an "occurrence of photoconductivity phenomenon" potentially correlative with superconductivity underlying even in the semiconducting specimen #S127 as displayed in FIG. 4B.

Discussion

It is a widely recognized fact that, of the oxides of the $Ca_{(2-x)}Sr_xBi_{(3-y)}Cu_yO_z$ group, a semiconductive specimen usually has gray color. The spectral photoresponse $Q(\lambda, T)$ of FIGS. 3A and 3B strongly suggests that there exists a region of the $Bi_2O_3$—like state in the specimens of $Ca_{(2-x)}Sr_xBi_{(3-y)}Cu_yO_z$ group, if not atomic layers.

Optical absorption and photoconductivity by $Bi_2O_3$ themselves have not been thoroughly analyzed yet in experiments at low temperature and in terms of the exciton theory. However, this seems to be a typical example of Frenkel type excitons of the charge transferable type in a cation shell or a few neighbors. The position of the fine structure in the $Q(\lambda, T)$ of the above-mentioned Ca-Sr-Bi-Cu-O group very well coincides with basic absorption end structure of the reference substance $Bi_2O_3$. The inventor can recognize a few outstanding fine structures which are probably due to the excitons. For instance, the spectra of photo-response of $Ca_2Bi_1Cu_2O_z$ are similar to those of the reference substance $Bi_2O_3$. In the proximity of $\lambda \cong 623$ nm of the spectra, the inventor notices such structure which could be considered to correspond to the state of n=2 in an exciton series of $Bi_2O_3$. Thus, one can reasonably conceive that there exists at least a finite fraction of the $Bi_2O_3$—like phase in the Ca-Sr-Bi-Cu-O group oxides which fraction cannot be ignored. In the $Bi_2O_3$-like phase, the photoexcited electrons and/or holes are definitely mobile. (see FIG. 5A.)

A conduction electron or a positive hole in standard types of $Bi_2O_3$ crystals has been reported to form a rather "small polaron" as discussed before in terms of the coupling constant $\alpha$. In any case, the "occurrence of photoresponse $Q(\lambda, T)$" in insulating specimens is clearly related to the "occurrence of superconductivity", as if potential superconductivity exists in the photoconductivity phenomenon. The effects of the polaron, whether it is a "large polaron" with the LO (longitudinal optical)-phonons, a "small polaron" due to the Jahn-Teller effect or possibly an intermediate one due to both effects, must be substantial at least potentially just like the "polaron effects due to electronic polarization" are, as shown in FIGS. 3A, 3B and FIGS. 4A, 4B, 4C. The effects of such polaron are probably effective in a coherently hybridized form of these elementary excitations. Special attention must be paid to polarons due to electronic polarization, which are also referred to as "excitonic polarons". As an outcome from the examination of the result of the above experiments, the inventor has noticed close correlation between the polarons and excitons.

Figure 5A:
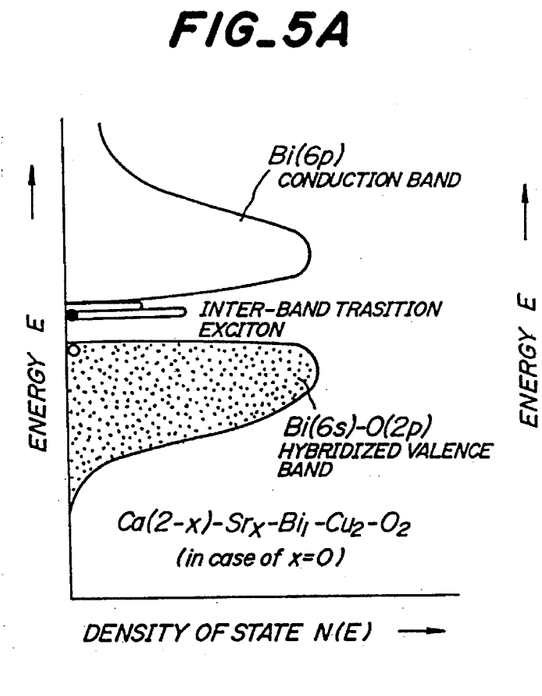
FIG. 5A and FIG. 5B are graphs showing the relationship between the energy E and the density of the state N(E) in the oxide of composition $Ca_{2-x}-Sr_x-Bi_1-Cu_2-O_z$, for the cases of $x=0$ and $x=1$, respectively.
Figure 5B:
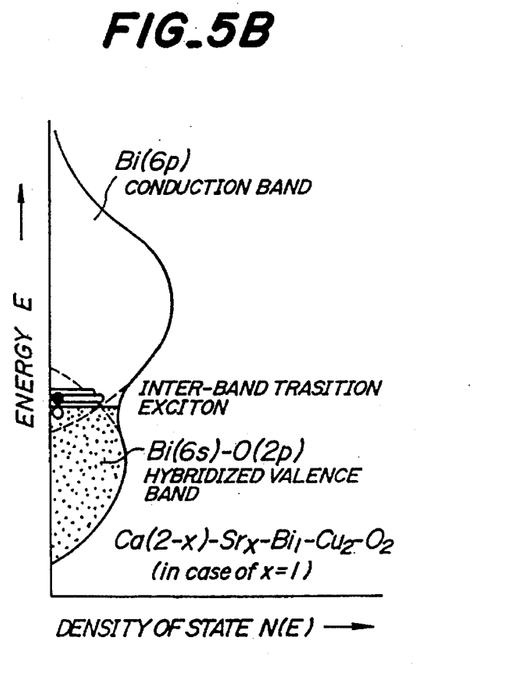

Referring to FIG. 5A, these polarons and excitons had yielded out of the optical inter-band transition from the hybridized 2p-O and 6s-Bi valence bands leaving a $(2p)^6(6s)^1$ positive hole (a white circle) to the 6p-Bi conduction band (possibly mixing with the Cu(4s, 3d) (not shown) depending on the case) creating a $(6p)^1$ conduction electron together with the LO-phonon interaction. A polaron of a Ca-Sr-Bi-Cu-O group oxide can be created either by the optical excitation here or substitution of Ca by Sr, as shown in FIG. 5B. Here, FIG. 5B refers to a superconductor with x=1. The positive hole in the 2p-O and 6s-Bi hybridized valence band can be produced from the many-body ground state through either chemical pressure induced intra-band or optically induced inter-band transition, and the electron correlation effects are of course very important. One must pay more attention to the dynamical valence fluctuation between $Cu^{+1}$ and $Cu^{+2}$, especially between $Bi^{3+}$ and $Bi^{5+}$, as well as between $Bi^{3+}$ and $Bi^{4+}$ and between $Cu^{2+}$ and $Cu^{3+}$. Therefore, for the mechanism of high-temperature superconductivity, one may reasonably conceive potential roles of an ensemble of polarons, whether large or small, and especially closely associated with excitons. The ensemble of united polarons and excitons here are probably a set of bipolarons, polaronic excitons and/or, most probably, "exciton-mediated bipolarons" due to the dynamical electron-phonon and electron correlation effects.

It was confirmed that the $Q(\lambda, T)$ of the Ca-Sr-Bi-Cu-O group oxide of FIG. 3B has a smaller wavelength dependence to that of the photoresponse $Q(\lambda, T)$ of $Bi_2O_3$ of FIG. 3B in the wavelength range of 530–740 nm. Consequently, the inventor believes that these studies of elementary excitations here must reveal the nature of the superconducting ground state, despite the enormous difference in the carrier density. To the best knowledge of the inventor, this is the first clear experimental indication of the fact that the Ca-Sr-Bi-Cu-O group oxide has superconductive photoconductivity, i.e., both a superconductivity and a photoconductivity. The polaron and exciton mechanisms, which were disclosed in the preceding patent applications of the inventor with respect to other high-Tc superconductors, have been experimentally confirmed to be displayed also in the oxide of the invention in a correlated manner.

The inventor has found, through the experimental study of the physical properties of the Ca-Sr-Bi-Cu-O group superconductive photoconductive oxide, that the critical temperatures for photoconductivity in the oxide of the invention coincide with the critical temperatures for superconductivity expected in the conventional superconductors, i.e., 115–105 K (high-Tc layer) and 85–65 K (low-Tc layer).

The inventor has also found, for the first time, the close correlation between the x-dependent "superconductivity" of the $Ca_{(X-x)}$-$Sr_x$-$Bi_{(Y-y)}$-$Cu_y$-$O_z$ group superconductive photoconductive oxide of the invention, e.g., at x=0, and the x-dependent "photoconductivity" of the same oxide, e.g., with x in the proximity of zero. Thus, the inventor reconfirmed the existence of the dynamical mechanisms due to polarons and excitons, i.e., the dynamical mechanisms due to "exciton-mediated bipolarons", in the high-Tc superconductivity Effect of the Invention Based on the foregoing description, we may safely conclude as follows.

The close correlation between "photoconductivity" and "superconductivity (zero resistance and diamagnetism)" in the temperature range of 4.2 to 300 K has been confirmed on the basis of extensive studies including conductivity measurements performed by using the D.C. 4-probe method and the repetitive pulse photoconductivity measuring method and static susceptibility measurement by using the microwave SQUID.

Both the "superconductive photoconductive oxide" of $Ca_{(X-x)}$-$Sr_x$-$Bi_{(Y-y)}$-$Cu_y$-$O_z$, X being 2 to 3, $0 \leq x < 1$, Y being 3 to 4, $0 < y \leq 2$, and z being 4 to 9, and the method for producing such oxide have been invented.

Theoretical analysis of "the dynamical mechanisms due to polarons and excitons", or the mechanism due to "exciton-mediated bipolarons", in the "high-Tc superconductivity" was performed and the invention was developed from such theoretical consideration.

The proposed oxide of the invention will open a new scientific and industrial field, to be named as "superconductive optoelectronics" wherein superconductivity is to be, whether directly or indirectly, controlled by light.

Although the invention has been described with a certain degree of particularly, it must be understood that the present disclosure has been made only by way of example and that numerous changes in details may be resorted to without departing from the scope of the invention as hereinafter claimed.

What is claimed is:

1. A method for eliciting the photoconductivity of a photoconductive substance of the Ca-Sr-Bi-Cu-O system having a general chemical formula $Ca_{(X-x)}$-$Sr_x$-$Bi_{(Y-y)}$-$Cu_Y$-$O_z$, X being 2 to 3, $0 \leq x \leq 0.7$, Y being 3 to 4, $0 < y \leq 2$, and z being 4 to 9, wherein said substance is an insulator or semiconductor in the dark at a temperature below 105 to 115 K and has a photoconductivity $Q(\lambda, T)$ at said temperature upon photoexcitation with irradiation in a wavelength range between 530 to 740 nm, which method comprises maintaining said photoconductive substance below said temperature while applying an electric field E across the photoconductive substance and exposing said photoconductive substance to photoexciting irradiation in the range between 530 and 740 nm, said irradiation having an intensity per unit length which is sufficiently high to elicit said photoexcitation.

2. The method as set forth in claim 1, wherein said substance is made of a sintered oxide and exhibits photoconductivity upon application of said electric field E and upon said photoexcitation.

3. The method of claim 2, wherein said photoexcitation is with a pulsed dye laser.

4. The method of claim 1, wherein said photoexcitation is with a pulsed dye laser.

* * * * *